US010209332B2

(12) United States Patent
Tomoda et al.

(10) Patent No.: US 10,209,332 B2
(45) Date of Patent: Feb. 19, 2019

(54) IN-FLOW SIGNAL REDUCTION FOR T1 WEIGHTED IMAGING IN A MAGNETIC RESONANCE IMAGING SYSTEM

(71) Applicant: General Electric Company, Schenectady, NY (US)

(72) Inventors: Yoshihiro Tomoda, Hino (JP); Masanori Ozaki, Hino (JP)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 380 days.

(21) Appl. No.: 15/046,095

(22) Filed: Feb. 17, 2016

(65) Prior Publication Data

US 2016/0245887 A1   Aug. 25, 2016

(30) Foreign Application Priority Data

Feb. 17, 2015   (JP) .................................. 2015-028659

(51) Int. Cl.
*G01R 33/56*   (2006.01)
*G01R 33/483*   (2006.01)

(52) U.S. Cl.
CPC ..... *G01R 33/4835* (2013.01); *G01R 33/4838* (2013.01); *G01R 33/5607* (2013.01)

(58) Field of Classification Search
CPC ............ G01R 33/4835; G01R 33/4838; G01R 33/5607
See application file for complete search history.

(56) References Cited

U.S. PATENT DOCUMENTS

| 5,079,504 A * | 1/1992 | Machida ............ G01R 33/4822 324/309 |
| 6,233,475 B1 * | 5/2001 | Kim ...................... A61B 5/055 324/309 |
| 2007/0069726 A1 | 3/2007 | Miyoshi |
| 2010/0226556 A1 * | 9/2010 | Kumai ............... G01R 33/5614 382/131 |

FOREIGN PATENT DOCUMENTS

| JP | 2000-342555 A | 12/2000 |
| JP | 2004-073251 A | 3/2004 |
| JP | 2004-524119 A | 8/2004 |

(Continued)

OTHER PUBLICATIONS

Machine translation of abstract & figures of Okamura (JP Pub No. 05-277,084 A); Pub date Oct. 26, 1993.*

(Continued)

*Primary Examiner* — Rodney A Bonnette

(57) ABSTRACT

An magnetic resonance apparatus 100 comprises dummy-slice defining unit 93. The dummy-slice defining unit 93 defines a dummy slice a in a region lying in a z-direction with respect to a group gr1, and a dummy slice b in a region lying in a (−z)-direction with respect to the group gr1. The dummy-slice defining unit 93 also defines a dummy slice c in a region lying in the z-direction with respect to a group gr2, and a dummy slice d in a region lying in the (−z)-direction with respect to the group gr2. The dummy-slice defining unit 93 further defines the dummy slices a, b, c, d so that the slice thickness of the dummy slices a, b, c, d is greater than that of slices L1 to L12.

15 Claims, 17 Drawing Sheets

(56) References Cited

FOREIGN PATENT DOCUMENTS

| | | |
|---|---|---|
| JP | 2007-082867 A | 4/2007 |
| JP | 2008-167977 A | 7/2008 |
| JP | 2012-147920 A | 8/2012 |
| JP | 2016-067713 A | 3/2016 |

OTHER PUBLICATIONS

JP OA for Application No. 2015-028659. Office Action dated Sep. 5, 2017. 4 pages.
Machine Translation and Notifications of Reasons for Refusal issued in connection with corresponding JP Application No. 2015-028659 dated May 29, 2018.

* cited by examiner

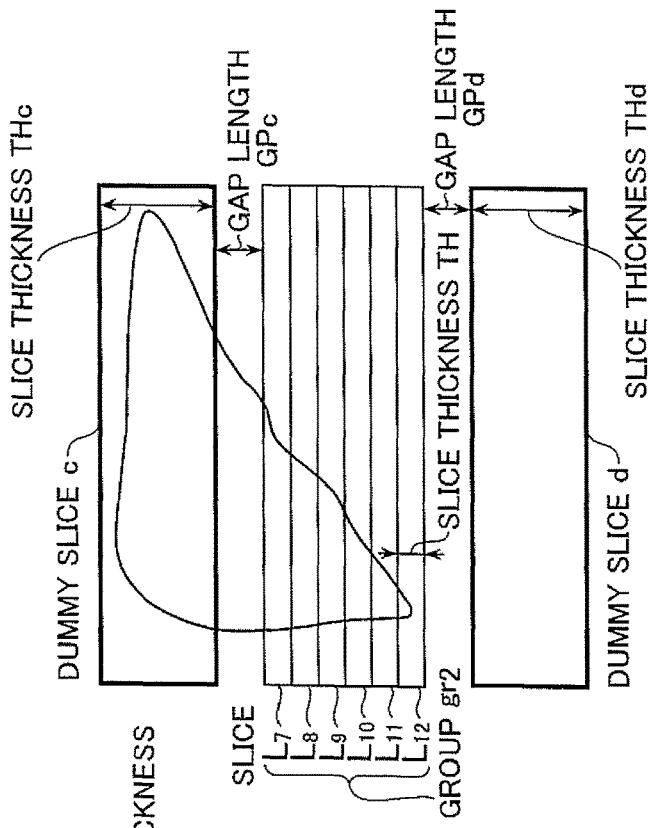
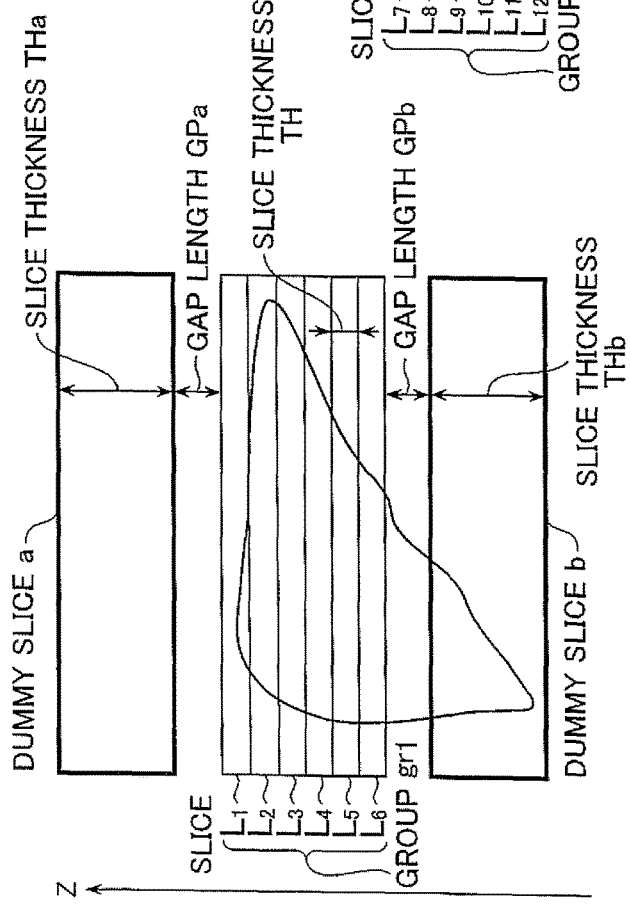

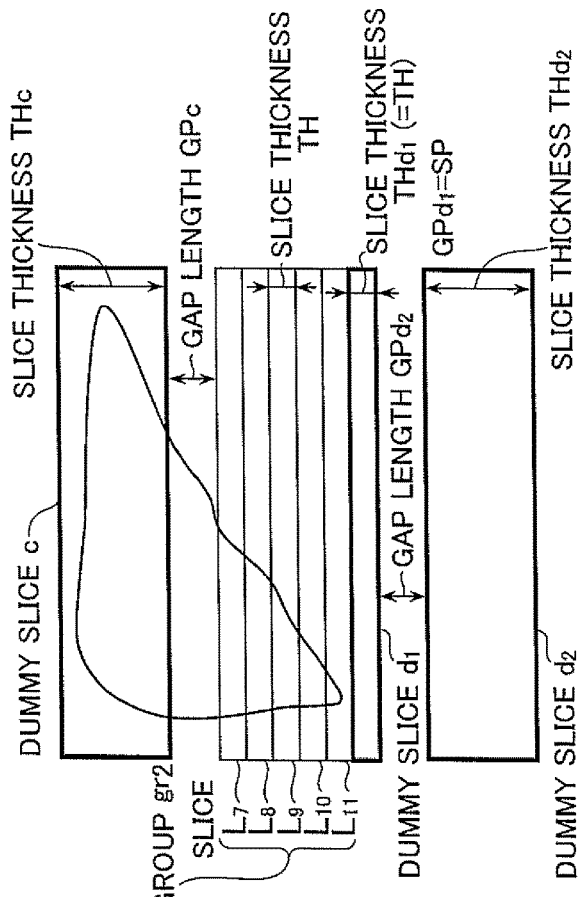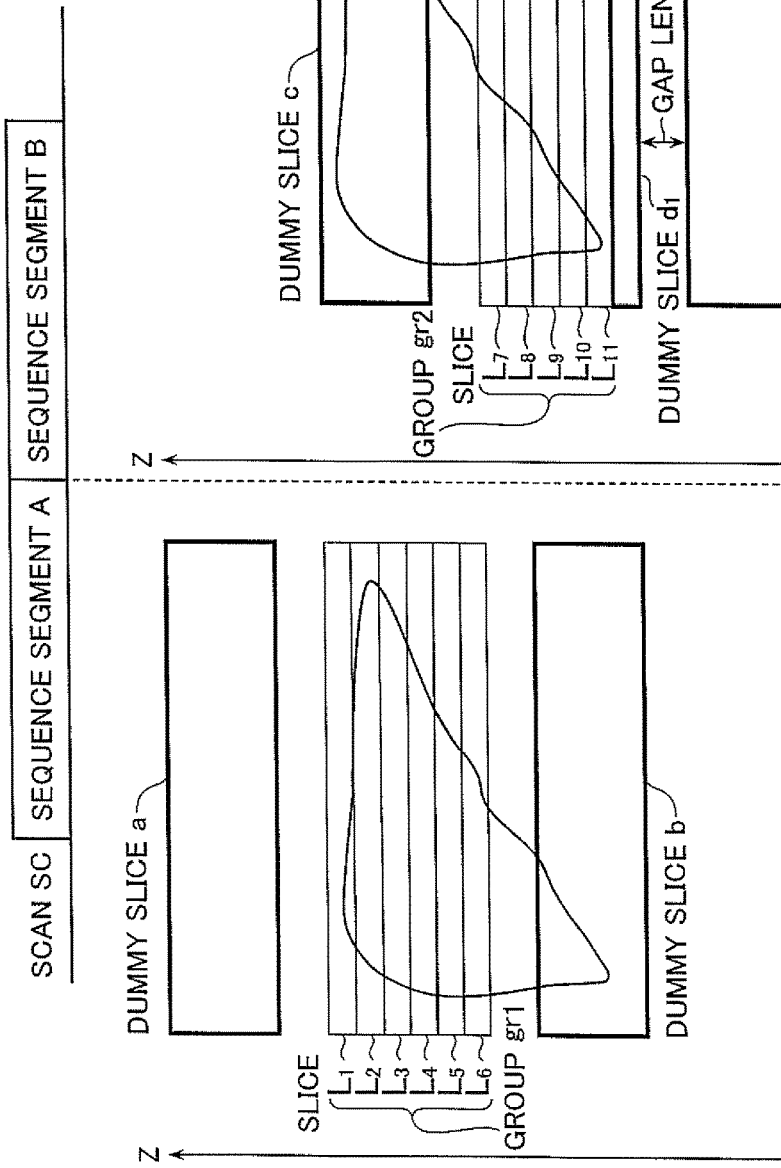

IN-FLOW SIGNAL REDUCTION FOR T1 WEIGHTED IMAGING IN A MAGNETIC RESONANCE IMAGING SYSTEM

CROSS-REFERENCE TO RELATED APPLICATIONS

This application claims priority to Japanese patent application number 2015-028659, filed on Feb. 17, 2015, the entirety of which is incorporated herein by reference.

BACKGROUND

The present invention relates to a magnetic resonance apparatus for scanning a region including blood, and a program applied to the magnetic resonance apparatus.

There has been known a method of obtaining a T1 or T2-weighted image or the like using a multi-slice technique.

T1-weighted imaging sometimes requires blood to have as low signals as possible so that a radiologist can efficiently make image diagnosis. However, it is sometimes impossible to sufficiently reduce blood signals because of an inflow effect, etc., of blood. Particularly, there is a problem that when imaging is performed by the multi-slice technique, blood tends to be rendered with high signals in slices at both ends among a plurality of defined slices. Therefore, it is desired to provide a technique preventing, as much as possible, blood from being rendered with high signals.

SUMMARY

A first aspect of the present invention is a magnetic resonance apparatus comprising a slice defining unit for defining a plurality of slices arranged in a first direction in a region including blood; a dummy-slice defining unit for defining a first dummy slice in a region lying in said first direction with respect to said plurality of slices, and a second dummy slice in a region lying in a direction opposite to said first direction with respect to said plurality of slices, said dummy-slice defining unit defining said first and second dummy slices so that a slice thickness of each of said first and second dummy slices is greater than that of each of said plurality of slices; a scanning section for repetitively performing a sequence group including a plurality of sequences for exciting said plurality of slices, said first dummy slice, and said second dummy slice, respectively; and an image producing unit for producing an image of each of said plurality of slices based on data acquired by performing said sequence group.

A second aspect of the present invention is a magnetic resonance apparatus comprising a slice defining unit for defining a plurality of slices arranged in a first direction in a region including blood; a grouping unit for dividing said plurality of slices into a plurality of groups; a dummy-slice defining unit for defining a first dummy slice in a region lying in said first direction with respect to said group, and a second dummy slice in a region lying in a direction opposite to said first direction with respect to said group, said dummy-slice defining unit defining said first and second dummy slices so that a slice thickness of each of said first and second dummy slices is greater than that of each of said plurality of slices; a scanning section for repetitively performing a sequence group including a plurality of sequences for exciting slices included in said group, said first dummy slice, and said second dummy slice; and an image producing unit for producing an image of each of said plurality of slices based on data acquired by performing said sequence group.

A third aspect of the present invention is a program applied to a magnetic resonance apparatus for: defining a plurality of slices arranged in a first direction in a region in which blood flows; defining a first dummy slice in a region lying in said first direction with respect to said plurality of slices, and a second dummy slice in a region lying in a direction opposite to said first direction with respect to said plurality of slices; repetitively performing a sequence group including a plurality of sequences for exciting said plurality of slices, said first dummy slice, and said second dummy slice, respectively; and producing an image of each of said plurality of slices based on data acquired by performing said sequence group, said program causing a computer to execute dummy-slice defining processing of defining said first and second dummy slices so that a slice thickness of each of said first and second dummy slices is greater than that of each of said plurality of slices.

A fourth aspect of the present invention is a program applied to a magnetic resonance apparatus for defining a plurality of slices arranged in a first direction in a region including blood; dividing said plurality of slices into a plurality of groups; defining a first dummy slice in a region lying in said first direction with respect to said group, and a second dummy slice in a region lying in a direction opposite to said first direction with respect to said group; repetitively performing a sequence group including a plurality of sequences for exciting slices included in said group, said first dummy slice, and said second dummy slice; and producing an image of each of said plurality of slices based on data acquired by performing said sequence group, said program causing a computer to execute dummy-slice defining processing of defining said first and second dummy slices so that a slice thickness of each of said first and second dummy slices is greater than that of each of said plurality of slices.

Blood signals may be reduced by placing a first dummy slice and a second dummy slice aside from slices and making the slice thickness of the first and second dummy slices greater than that of each one of the plurality of slices.

BRIEF DESCRIPTION OF DRAWINGS

FIGS. 6A and 6B are diagrams schematically showing dummy slices defined for each group.

FIGS. 14A and 14B are diagrams showing dummy slices.

DETAILED DESCRIPTION

Figure 1:
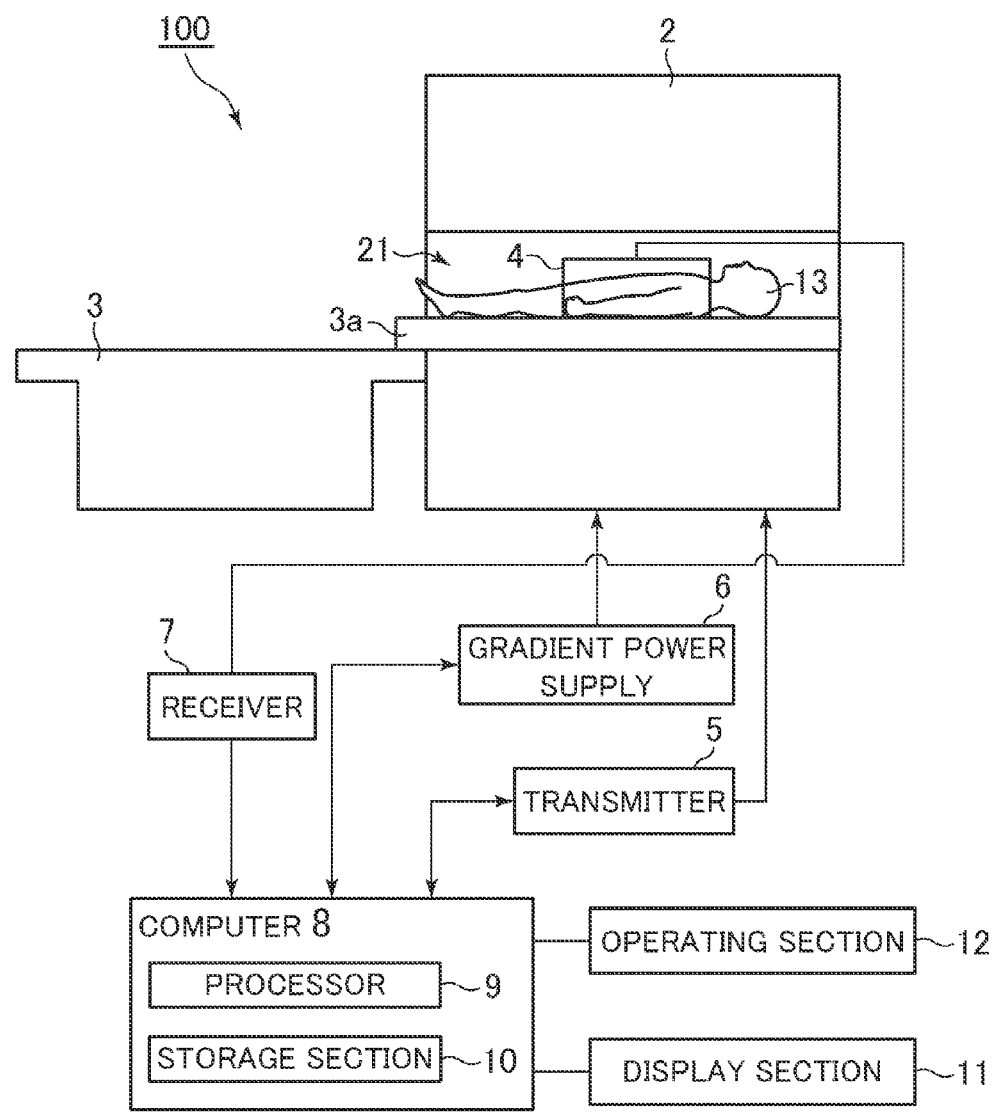
FIG. 1 is a schematic diagram of a magnetic resonance apparatus in one embodiment of the present invention.

FIG. 1 is a schematic diagram of a magnetic resonance apparatus in one embodiment of the present invention. A magnetic resonance apparatus (referred to as "MR apparatus" hereinbelow) 100 comprises a magnet 2, a table 3, and an RF receive coil (referred to simply as "receive coil" hereinbelow) 4.

The magnet 2 has therein a reception space 21 inside of which a subject 13 is received. In the magnet 2, a superconductive coil, a gradient coil, an RF coil, etc. (not shown) are incorporated. The superconductive coil applies a static magnetic field, the gradient coil applies a gradient magnetic pulses, and the RF coil applies an RF pulse.

The table 3 has a cradle 3a. The cradle 3a is configured to be movable into the reception space 21 in the magnet 2. The subject 13 is carried into the reception space 21 in the magnet 2 by the cradle 3a.

The receive coil 4 is attached covering from the abdomen up to the chest of the subject 13. The receive coil 4 receives magnetic resonance signals from the subject 13.

The MR apparatus 100 further comprises a transmitter 5, a gradient power supply 6, a receiver 7, a computer 8, an operating section 11, and a display section 12.

The transmitter 5 supplies electric current to the RF coil, and the gradient power supply 6 supplies electric current to the gradient coil. The receiver 7 applies signal processing such as demodulation/detection to signals received from the receive coil 4. The magnet 2, receive coil 4, transmitter 5, gradient power supply 6, and receiver 7 together constitute the scanning section.

The computer 8 controls operation of several sections in the MR apparatus 100 to implement several kinds of operation of the MR apparatus 100, such as an operation of transmitting required information to the display section 11, and an operation of reconstructing images. The computer 8 comprises a processor 9 and a storage section 10.

Figure 2:
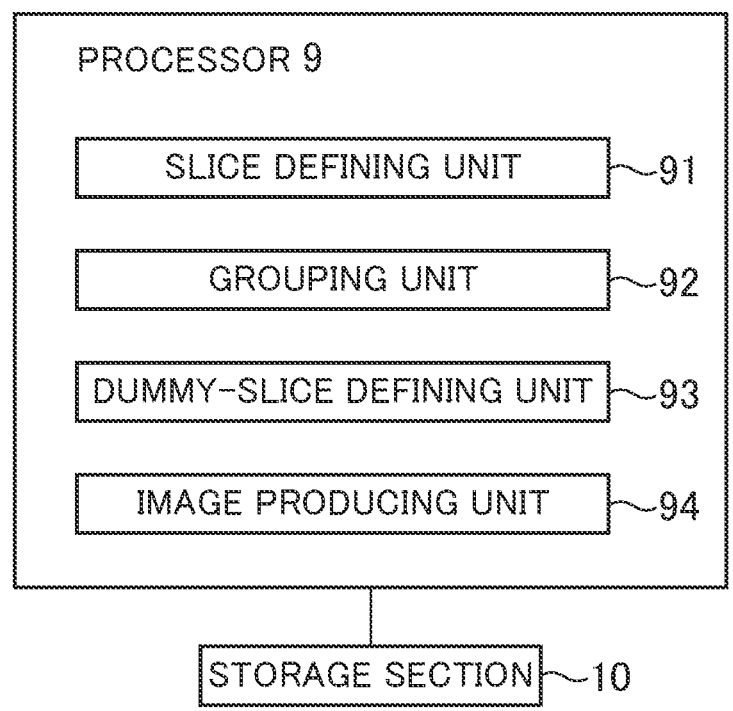
FIG. 2 is a diagram showing processing a processor 9 executes.

The storage section 10 stores therein programs etc. executed by the processor 9. The storage section 10 may be a computer-readable non-transitory recording medium. For the non-transitory recording media, a CD-ROM, for example, may be employed. The processor 9 loads thereon a program stored in the storage section 10, and executes processing written in the program. FIG. 2 shows processing the processor 9 executes. The processor 9 constitutes slice defining unit 91 through image producing unit 94, etc. by loading programs stored in the storage section 10.

The slice defining unit 91 defines slices based on information input from the operating section. The grouping unit 92 divides the slices defined by the slice defining unit 91 into a plurality of groups. The dummy-slice defining unit 93 defines a dummy slice used for reducing signals of blood entering the slices defined by the slice defining unit 91. The image producing unit 94 produces an image based on data acquired by a scan.

The processor 9 is an example for constituting the slice defining unit 91 through image producing unit 94, and it functions as these units by executing predefined programs.

The operating section 11 (input section) is operated by an operator for inputting several kinds of information to the computer 8. The display section 12 displays several kinds of information. The MR apparatus 100 is constructed as described above. Now the flow from setting of scan conditions to imaging of a subject according to the present embodiment will be described.

Figure 3:
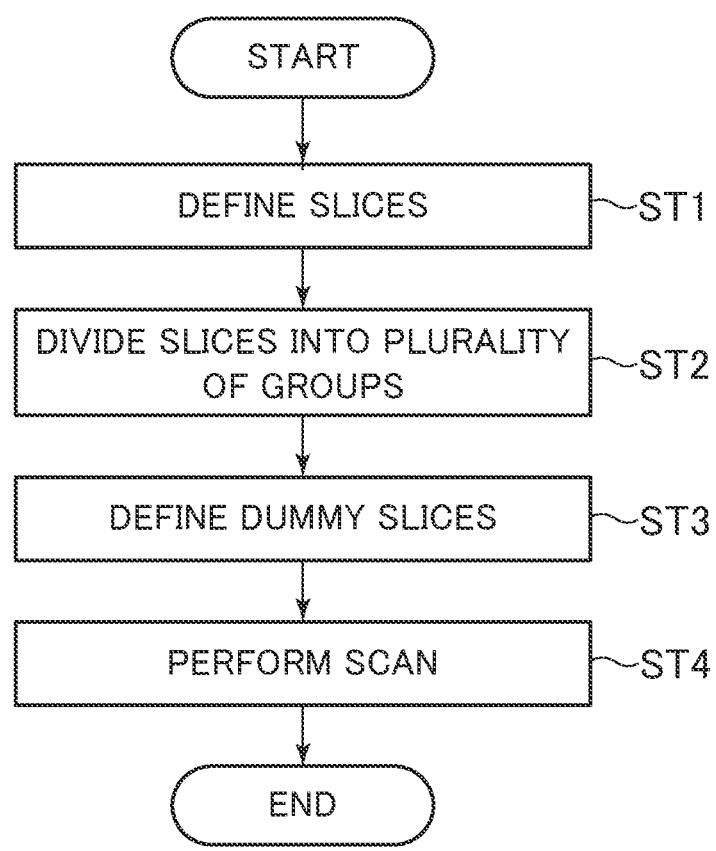
FIG. 3 is a diagram showing the flow from setting of scan conditions to imaging of a subject.
Figure 4:
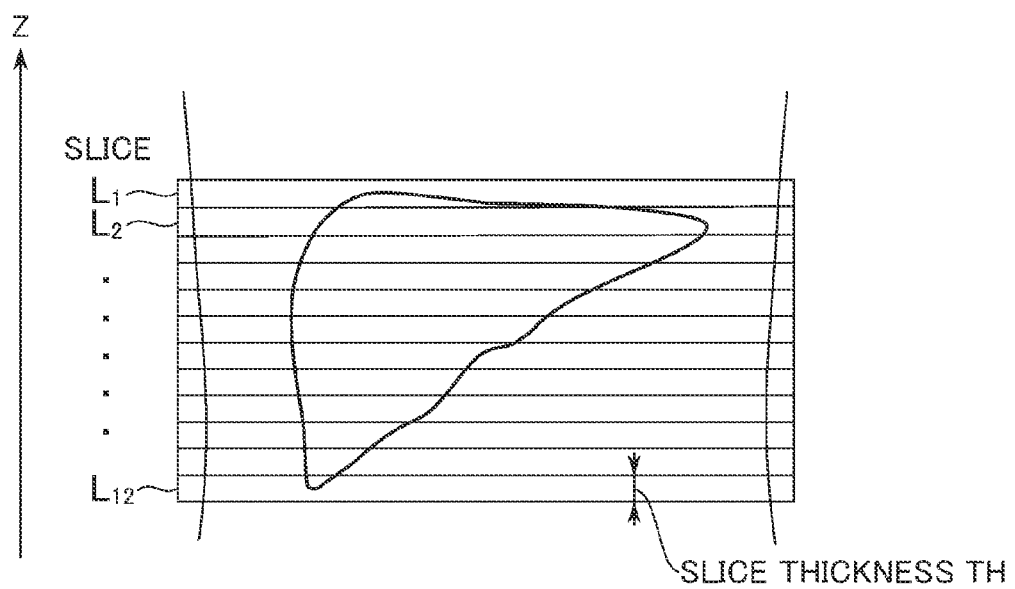
FIG. 4 is a diagram schematically showing exemplary slices L1 to L12 defined in a liver.

FIG. 3 is a diagram showing the flow from setting of scan conditions to imaging of a subject. At Step ST1, an operator defines slices in an imaged region. The present embodiment assumes that a liver is the imaged region. Therefore, the operator defines slices in the liver. The operator operates the operating section 11 (see FIG. 1) to input information for defining slices. As soon as the information has been input from the operating section 11, the slice defining unit 91 (see FIG. 2) defines slices based on the information input from the operating section 11. FIG. 4 schematically shows exemplary slices L1 to L12 defined in the liver. The slices L1 to L12 are defined to be arranged in a z-direction. The number N of slices is determined based on the size of the liver, the slice thickness, and the like. In FIG. 4, the number N of slices is assumed to be N=12 for convenience of explanation. The slice thickness TH may be set to a few millimeters, for example. In FIG. 4, spacing SP representing a gap length between adjacent slices is defined as SP=0 for convenience of explanation, although SP>0 or SP<0 (which means that the adjacent slices overlap each other) may hold. After defining the slices L1 to L12, the flow goes to Step ST2.

Figure 5B:
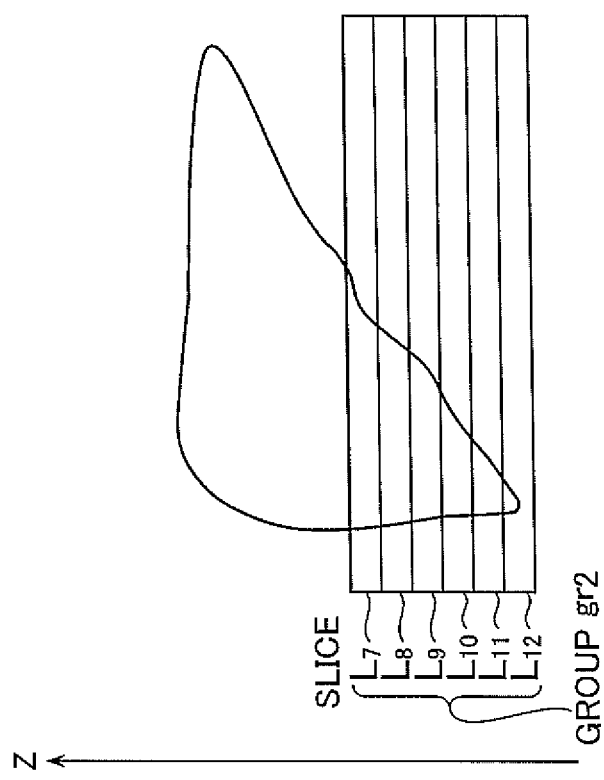
FIGS. 5A and 5B are diagrams showing slices divided into a plurality of groups.
Figure 5A:
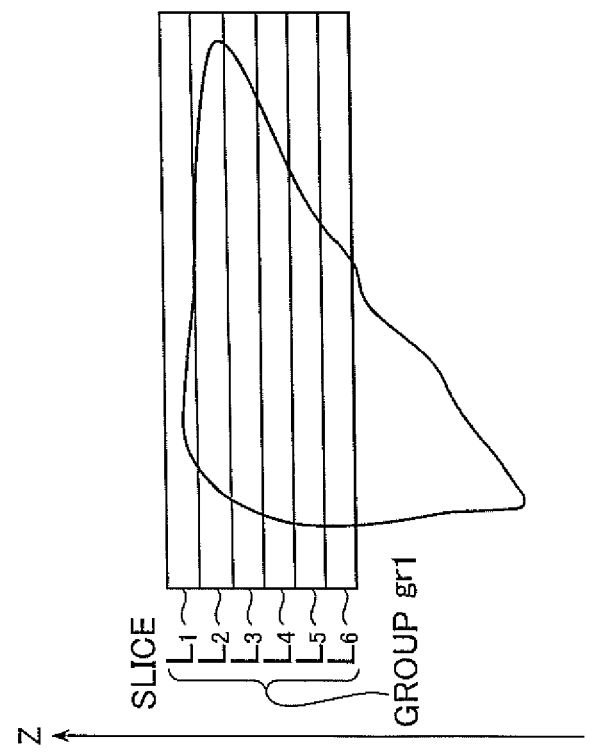

At Step ST2, the grouping unit 92 (see FIG. 2) divides the slices L1 to L12 into a plurality of groups. FIGS. 5A and 5B show the slices divided into a plurality of groups. The present embodiment assumes that the slices are divided into two groups: gr1 and gr2. The group gr1 includes six slices L1 to L6, while the group gr2 includes six slices L7 to L12. After dividing the slices L1 to L12 into the groups gr1 and gr2, the flow goes to Step ST3.

At Step ST3, the dummy-slice defining unit 93 (see FIG. 2) defines a dummy slice for each group, where the dummy slice represents a slice for which no image is produced. FIGS. 6A and 6B schematically show dummy slices defined for each group.

For the group gr1, dummy slices a and b are defined. The dummy slice a is defined in a region lying in a z-direction with respect to the group gr1 of slices, while the dummy slice b is defined in a region lying in a direction ((−z)-direction) opposite to the z-direction with respect to the group gr1 of slices. In the group gr1, the slice L1 lies closest to the dummy slice a, and the slice L6 lies closest to the dummy slice b.

The dummy slice a is defined to place a gap length GPa between the dummy slice a and slice L1. The dummy slice b is defined to place a gap length GPb between the dummy slice b and slice L6. The gap lengths GPa and GPb are preset as a default value, and set to a few millimeters, for example. GPa and GPb may be such that GPa=GPb or GPa≠GPb. In the present embodiment, GPa=GPb.

A slice thickness THa of the dummy slice a and a slice thickness THb of the dummy slice b are defined to be greater than the slice thickness TH of the slices L1 to L6. That is, the slices THa and THb are defined such that THa>TH and THb>TH. The slice thicknesses THa and THb are preset as a default value, and set to a few centimeters, for example. THa and THb may be such that THa=THb or THa≠THb. In the present embodiment, THa=THb.

For the group gr2, dummy slices c and d are defined. The dummy slice c is defined in a region lying in a z-direction with respect to the group gr2 of slices, while the dummy slice d is defined in a region lying in a direction ((−z)-direction) opposite to the z-direction with respect to the group gr2 of slices. In the group gr2, the slice L7 lies closest to the dummy slice c, and the slice L12 lies closest to the dummy slice d.

The dummy slice c is defined to place a gap length GPc between the dummy slice c and slice L7. The dummy slice d is defined to place a gap length GPd between the dummy slice d and slice L12. The gap lengths GPc and GPd are set to a few millimeters, for example. GPc and GPd may be such that GPc=GPd or GPc≠GPd. In the present embodiment, GPc=GPd.

A slice thickness THc of the dummy slice c and a slice thickness THd of the dummy slice d are defined to be greater than the slice thickness TH of the slices L7 to L12. That is, the slices THc and THd are defined such that THc>TH and THd>TH. As with the slice thicknesses THa and THb, the slice thicknesses THc and THd are preset as a default value, and set to a few centimeters, for example. THc and THd may be such that THc=THd or THc≠THd. In the present embodiment, THc=THd. After defining the dummy slices, the flow goes to Step ST4.

Figure 7:
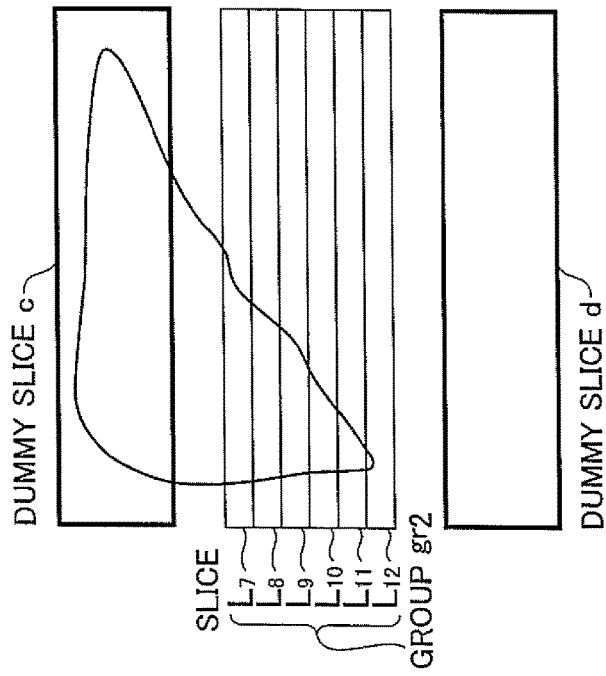
FIGS. 7A and 7B are explanatory diagrams of a scan.
Figure 7:
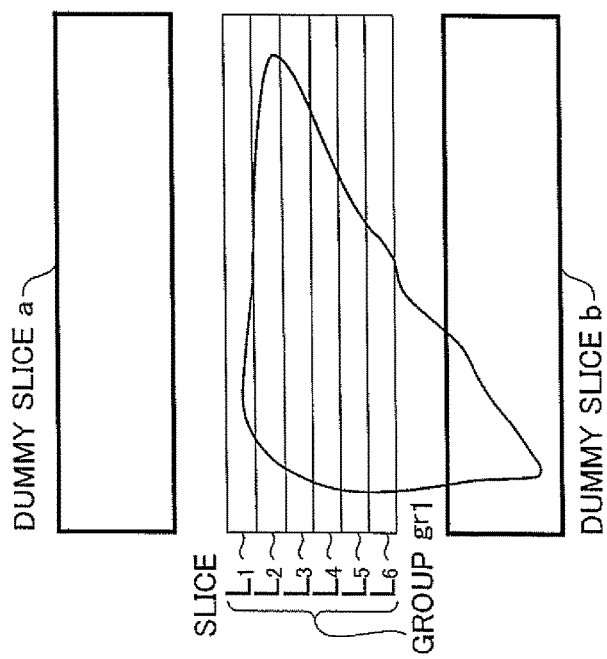

At Step ST4, a scan is performed. FIGS. 7A and 7B are explanatory diagrams of a scan. A scan SC is performed while the subject is holding his/her breath. The scan SC is a scan that uses a Fast Gradient Echo technique to acquire data for a T1-weighted image from the slices L1 to L12. In the scan SC, two sequence segments A and B are performed.

The sequence segment A excites the slices L1 to L6 in the group gr1, dummy slice a, and dummy slice b according to the multi-slice technique. In the present embodiment, images of the slices L1 to L6 in the group gr1 are produced, whereas no images are produced for the dummy slices a and b. Therefore, when the sequence segment A is performed, data for the slices L1 to L6 in the group gr1 are acquired, whereas those for the dummy slices a and b are discarded.

The sequence segment B excites the slices L7 to L12 in the group gr2, dummy slice c, and dummy slice d according to the multi-slice technique. In the present embodiment, images of the slices L7 to L12 in the group gr2 are produced, whereas no images are produced for the dummy slices c and d. Therefore, when the sequence segment B is performed, data for the slices L7 to L12 in the group gr2 are acquired, whereas those for the dummy slices c and d are discarded. Now the sequence segments A and B will be particularly described.

Figure 8:
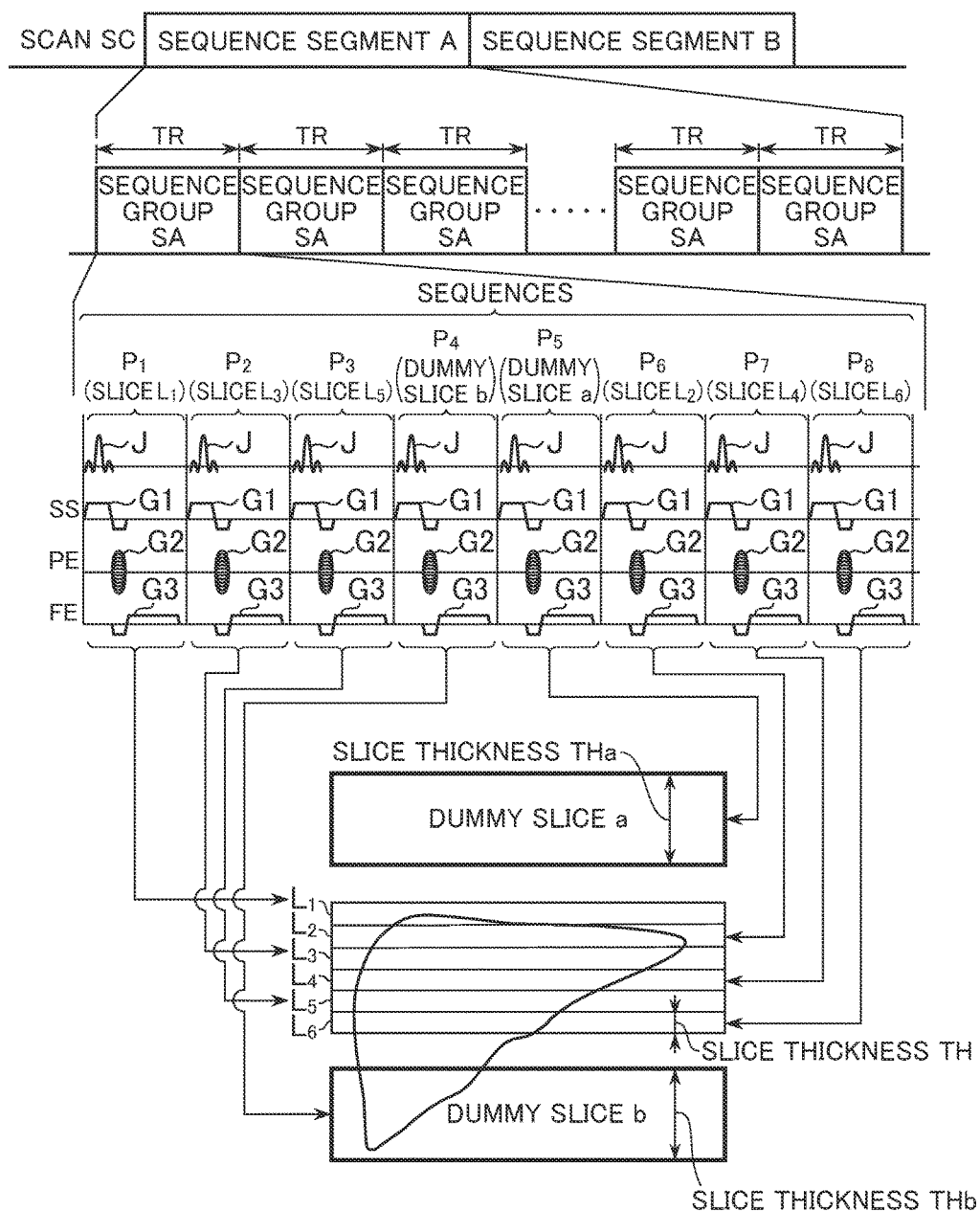
FIG. 8 is an explanatory diagram of a sequence segment A.

FIG. 8 is an explanatory diagram of the sequence segment A. In the sequence segment A, a sequence group SA is performed during each repetition time TR. The sequence group SA includes a plurality of sequences for exciting the slices L1 to L6, dummy slice a, and dummy slice b according to the multi-slice technique, and acquiring data for the slices L1 to L6. The sequence group SA includes sequences P1 to P8.

The sequences P1, P2, and P3 are sequences for exciting the slices L1, L3, and L5, respectively. The sequences P4 and P5 are sequences for exciting the dummy slices b and a, respectively. The sequences P6, P7, and P8 are sequences for exciting the slices L2, L4, and L6, respectively. Therefore, in the present embodiment, slice excitation is achieved in the order of the slices L1, L3, L5, dummy slices b, a, and slices L2, L4, and L6.

Each of the sequences P1 to P8 has an excitation pulse J, a slice-selective gradient pulse G1 applied in a slice-selective direction SS, a phase-encoding gradient pulse G2 applied in a phase-encoding direction PE, and a frequency-encoding gradient pulse G3 applied in a frequency-encoding direction FE. The excitation pulse J and slice gradient pulse G1 excite a slice. In the present embodiment, the excitation pulse J has the same waveform in the sequences P1 through P8. However, the magnetic field intensity for the slice-selective gradient pulse G1 in the sequences P4 and P5 is set to a value smaller than that for the slice-selective gradient G1 in the sequences P1, P2, P3, P6, P7, and P8. By thus constituting the excitation pulse J and slice-selective gradient G1, the slice thicknesses THa and THb of the dummy slices a and b can be greater than the slice thickness TH of the slices L1 to L6. In the present embodiment, only data acquired from the slices L1 to L6 are used as data for image reconstruction, and data acquired from the dummy slices a and b are discarded. After performing the sequence segment A, the sequence segment B is performed (see FIG. 9).

Figure 9:
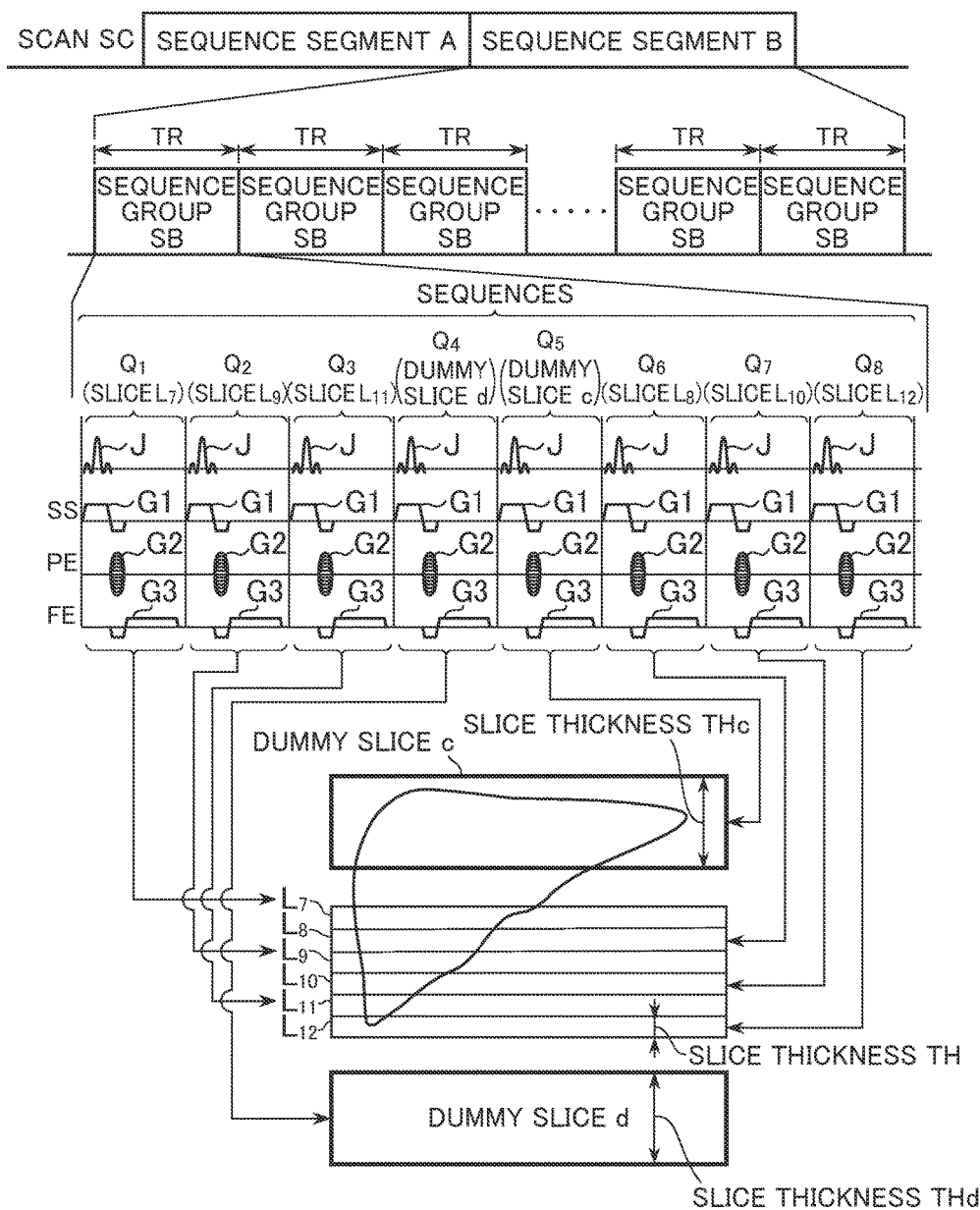
FIG. 9 is an explanatory diagram of a sequence segment B.

FIG. 9 is an explanatory diagram of the sequence segment B. In the sequence segment B, a sequence group SB is performed during each repetition time TR. The sequence group SB includes a plurality of sequences for exciting the slices L7 to L12, dummy slice c, and dummy slice d according to the multi-slice technique, and acquiring data for the slices L7 to L12. The sequence group SB includes sequences Q1 to Q8.

The sequences Q1, Q2, and Q3 are sequence for exciting the slices L7, L9, and L11, respectively. The sequences Q4 and Q5 are sequence for exciting the dummy slices d and c, respectively. The sequences Q6, Q7, and Q8 are sequence for exciting the slices L8, L10, and L12, respectively. Therefore, in the present embodiment, slice excitation is achieved in the order of the slices L7, L9, L11, dummy slices d, c, and slices L8, L10, and L12.

Each of the sequences Q1 to Q8 has an excitation pulse J, a slice-selective gradient pulse G1 applied in the slice-selective direction SS, a phase-encoding gradient pulse G2 applied in the phase-encoding direction PE, and a frequency-encoding gradient pulse G3 applied in the frequency-encoding direction FE. The excitation pulse J and slice gradient pulse G1 excite a slice. In the present embodiment, the excitation pulse J has the same waveform in the sequences Q1 through Q8. However, the magnetic field intensity for the slice-selective gradient pulse G1 in the sequence Q4 and Q5 is set to a value smaller than that for the slice-selective gradient G1 in the sequences Q1, Q2, Q3, Q6, Q7, and Q8. By thus constituting the excitation pulse J and slice-selective gradient G1, the slice thicknesses THc and THd of the dummy slices c and d can be greater than the slice thickness TH of the slices L7 to L12. In the present embodiment, only data acquired from the slices L7 to L12 are used as data for image reconstruction, and data acquired from the dummy slices c and d are discarded.

Therefore, by performing the sequence segments A and B, data required for image reconstruction can be acquired from each of the slices L1 to L12. The image producing unit 94 (see FIG. 2) produces a T1-weighted image for each of the slices L1 to L12 based on the data acquired by the scan SC. The flow is thus terminated.

In the present embodiment, the dummy slices a, b, c, and d are placed besides the slices L1 to L12. By placing the dummy slices a, b, c, and d, an effect is achieved that blood entering the slices L1 to L12 are made to have low signals. A reason why the effect is achieved will be described hereinbelow.

To clarify the effect of the dummy slices a, b, c, and d, a problem arising when the dummy slices a, b, c, and d are not placed will be described first. After describing the problem, the effect achieved by placing the dummy slices a, b, c, and d will be explained.

Figure 10:
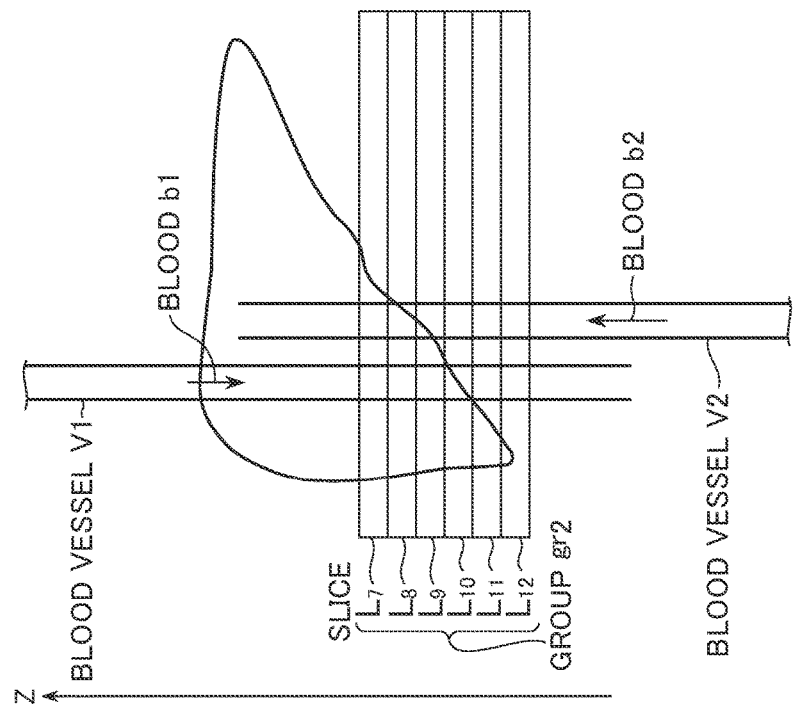
FIGS. 10A and 10B are explanatory diagrams of a problem arising when dummy slices a, b, c, d are not placed.
Figure 10:
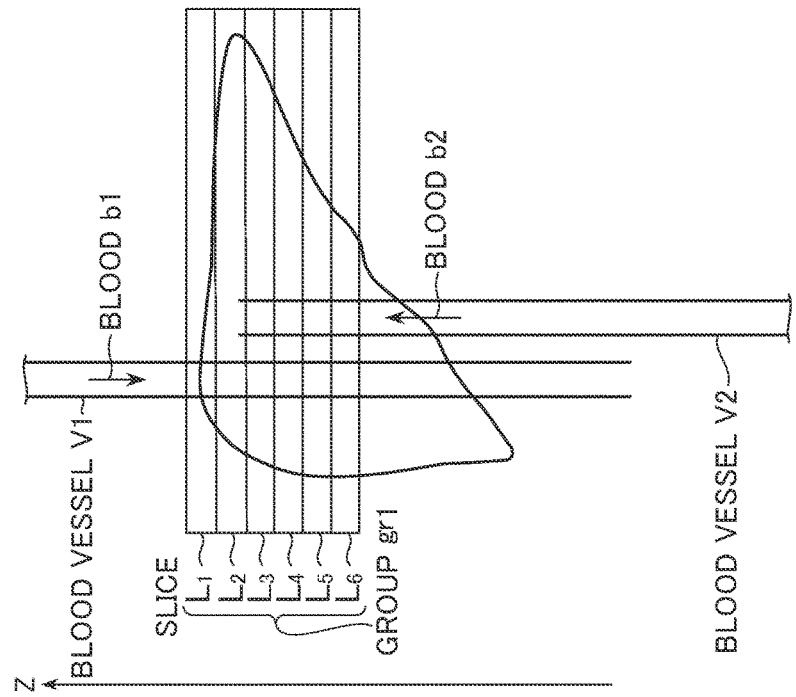

FIGS. 10A and 10B are explanatory diagrams of a problem arising when the dummy slices a, b, c, and d are not placed. FIG. 10A shows a case in which the dummy slices a and b are not placed for the slices L1 to L6 in the group gr1, and FIG. 10A shows a case in which the dummy slices c and d are not placed for the slices L7 to L12 in the group gr2.

FIG. 10A will be first explained. Referring to FIG. 10A, two blood vessels V1 and V2 are schematically shown. The blood vessel V1 carries blood b1 flowing toward the (−z)-direction, and the blood vessel V2 carries blood b2 flowing toward the z-direction.

While in FIG. 10A, each of the slices L1 to L6 is excited by an excitation pulse during each repetition time TR, no excitation by the excitation pulse is effected outside of the slices L1 to L6. Therefore, when the blood b1 has reached the slice L1, blood b1 has longitudinal magnetization of some magnitude. This causes a problem that the blood b1 tends to be rendered with high signals in the slices L1 to L6 due to the inflow effect of the blood b1. This problem appears most significantly in the slice L1.

The blood b2 flowing through the blood vessel V2 is not affected by the excitation pulse before it reaches the slice L6, and therefore, when it has reached the slice L6, it has longitudinal magnetization of some magnitude. This causes a problem that the blood b2 tends to be rendered with high signals in the slices L1 to L6 due to the inflow effect of the blood b2. This problem appears most significantly in the slice L6.

Therefore, there is a problem that blood tends to be rendered with high signals in the slices L1 to L6 (especially, in the slices L1 and L6 at both ends). Such blood with high signals is a trouble to radiologists performing image diagnosis. Moreover, when performing a scan using a contrast medium, blood flowing through a slice is required to be kept at as low signals as possible until the contrast medium reaches the slice. Referring to FIG. 10A, however, blood tends to be rendered with high signals due to the inflow effect of the blood even when the contrast medium has not reached yet, which problematically makes it difficult to study hemodynamics using a contrast medium.

The problem in acquiring data for the slices L1 to L6 is explained above with reference to FIG. 10A, and a similar explanation applies to the problem in FIG. 10B. Referring to FIG. 10B, there is a problem that the blood b1 and b2 tend to be rendered with high signals in the slices L7 to L12 (especially, the slices L7 and L12 at both ends). To address these problems, the present embodiment places dummy slices.

Figure 11:
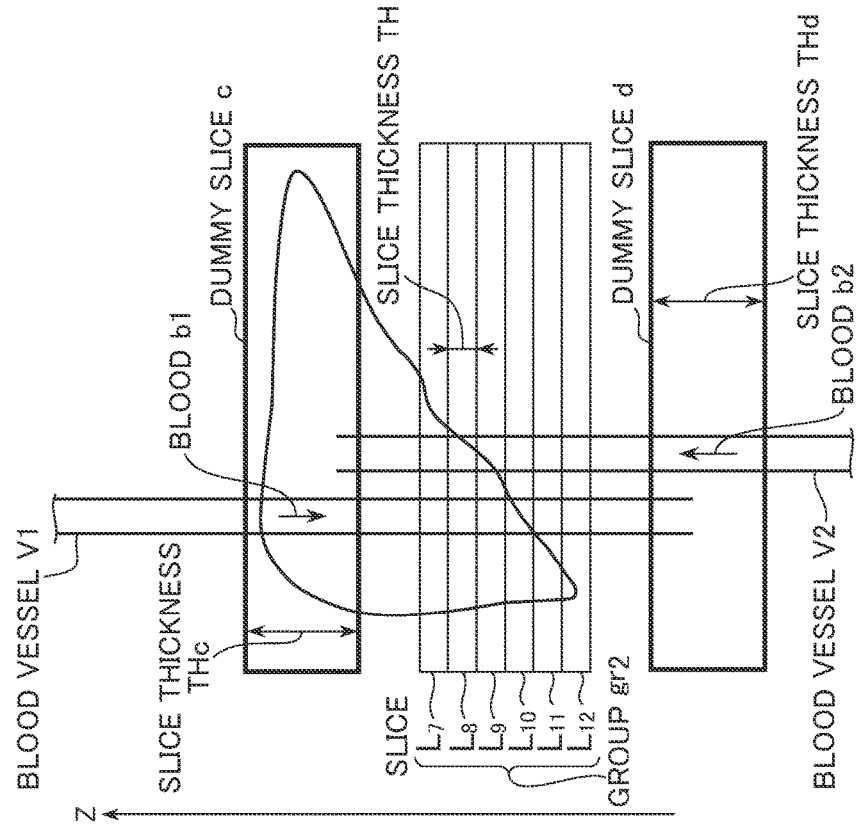
FIGS. 11A and 11B are explanatory diagrams of an effect of the dummy slices.
Figure 11:
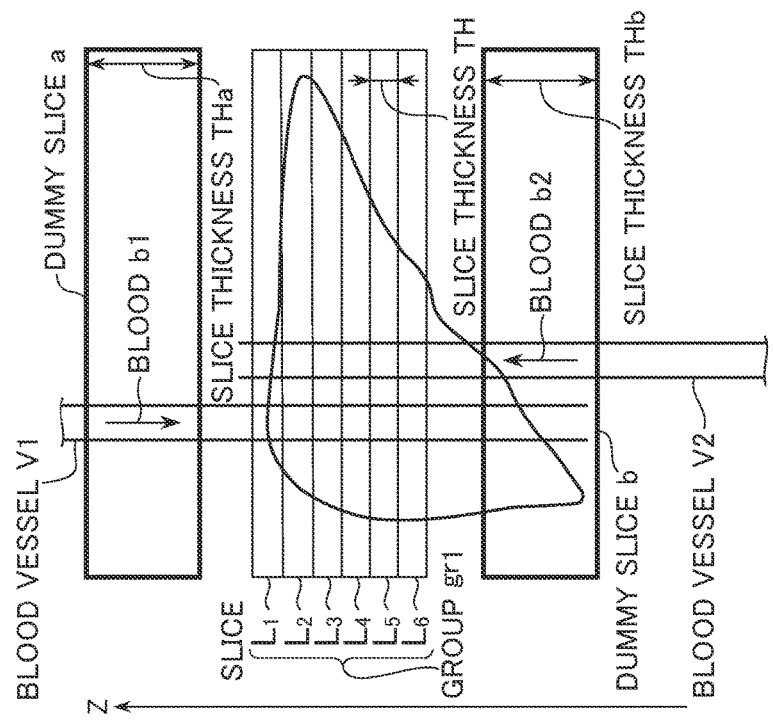

FIGS. 11A and 11B are explanatory diagrams of an effect of the dummy slices. Referring to FIG. 11A, dummy slices a and b are excited during each repetition time TR. Therefore, the blood b1 and b2 have reduced longitudinal magnetization affected by the RF pulses for exciting the dummy slices a and b, respectively. Therefore, the blood b1 enters the slice L1 with sufficiently reduced longitudinal magnetization and the blood b2 enters the slice L6 with sufficiently reduced longitudinal magnetization, thus lowering blood signals in the slices.

Referring to FIG. 11B, dummy slices c and d are excited during each repetition time TR. Therefore, the blood b1 and b2 have reduced longitudinal magnetization affected by the RF pulses for exciting the dummy slices c and d, respectively. Therefore, the blood b1 enters the slice L7 with sufficiently reduced longitudinal magnetization and the blood b2 enters the slice L12 with sufficiently reduced longitudinal magnetization, thus lowering blood signals in the slices.

However, longitudinal magnetization of blood sometimes cannot be sufficiently reduced when the dummy slices a, b, c, and d have small slice thicknesses THa, THb, THc, and THd. Accordingly, in the present embodiment, the slice thicknesses THa, THb, THc, and THd of the dummy slices are greater than the slice thickness TH of the slices L1 to L12 so that longitudinal magnetization of blood may be sufficiently reduced. Thus, longitudinal magnetization of blood can be sufficiently reduced while the blood is flowing through the dummy slice, thus sufficiently lowering blood signals in the slices L1 to L12.

Since dummy slices are placed and longitudinal magnetization of blood may be sufficiently reduced by making the slice thickness of the dummy slices a, b, c, and d greater than the slice thickness TH of the slices L1 to L12 as described above, blood signals in the slices can be sufficiently lowered. Moreover, when a scan is performed using a contrast medium, blood in slices can be sufficiently lowered until the contrast medium reaches the slices. This proves that the present invention is also suitable for hemodynamic evaluation using a contrast medium.

In performing the sequence segment A, slice excitation is achieved in the order of the slices L1, L3, L5, dummy slices b, a, and slices L2, L4, and L6 in the present embodiment. In performing the sequence segment B, slice excitation is achieved in the order of the slices L7, L9, L11, dummy slices d, c, and slices L8, L10, and L12. However, slice excitation may be achieved in another excitation order insofar as blood entering the slices may be made to have low signals.

Figure 12:
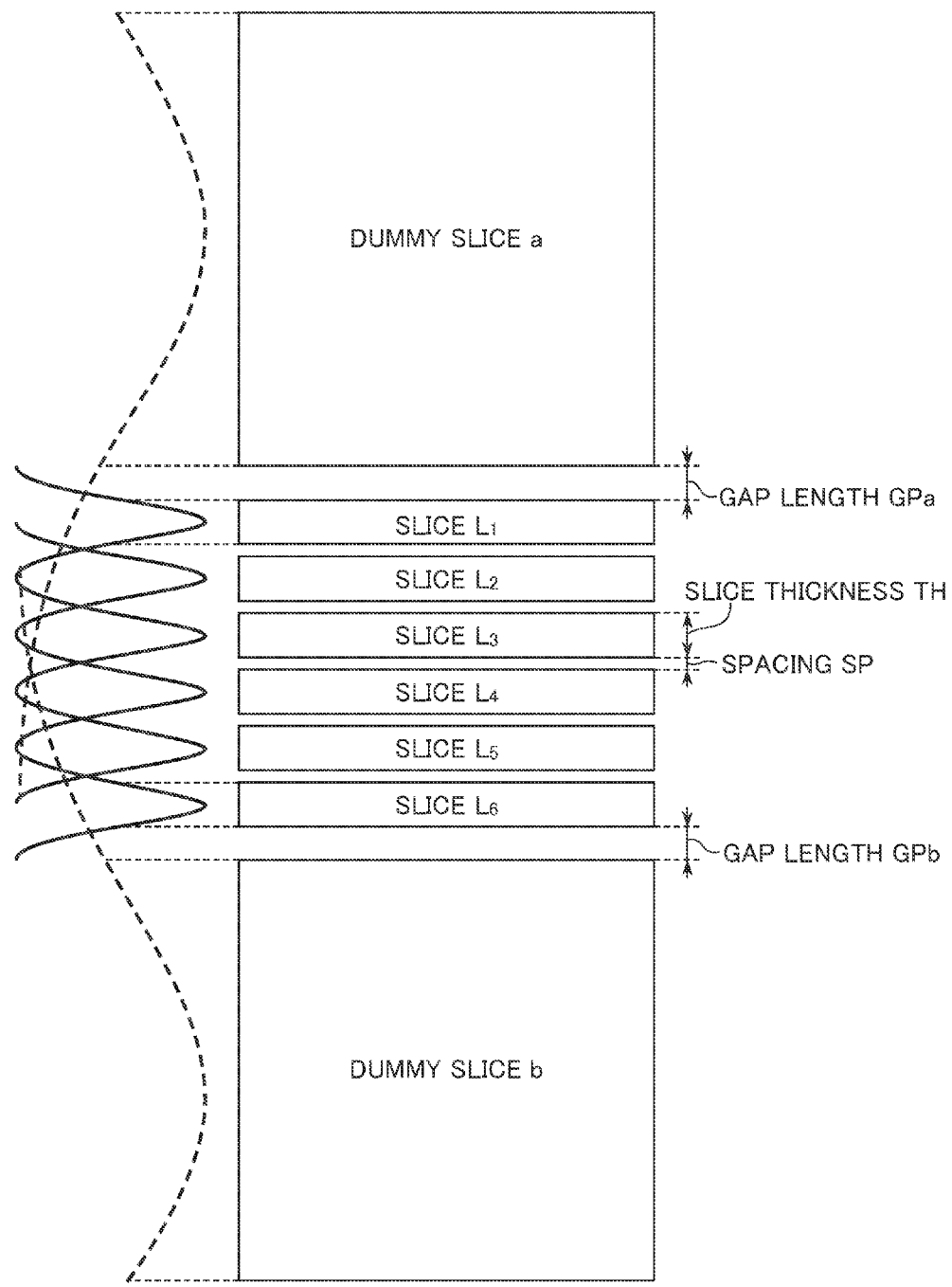
FIG. 12 is a diagram showing an excitation profile of the slices in comparison with that of the dummy slices.

FIG. 12 is a diagram showing an excitation profile of the slices L1 to L6 in comparison with that of the dummy slices a and b. FIG. 12 shows a case in which the spacing SP representing an interval between mutually adjacent ones of the slices L1 to L6 is defined as SP>0.

Referring to FIG. 12, the slices L1 to L6 and dummy slices a and b are shown, and excitation profiles corresponding to the slices are shown on the left of the slices. The excitation profile of the slices L1 to L6 is designated by solid lines and that of the dummy slices a and b is designated by dashed lines.

There is placed a gap length GPa between the dummy slice a and slice L1. Too small a gap length GPa increases crosstalk between the dummy slice a and slice L1, sometimes resulting in an image of the slice L1 darker than those of the other slices (for example, slices L2 and L3). Therefore, it is desirable to prevent the gap length GPa from having too small a length. On the other hand, too large a gap length GPa may cause blood entering the slice L1 to be rendered with high signals because longitudinal magnetization of the blood is recovered to some degree in the meantime after the blood exited the dummy slice a until it enters the slice L1. Therefore, it is desirable to determine the gap length GPa from the viewpoint that the blood signals in the slice L1 should be reduced as much as possible and from the viewpoint that the image of the slice L1 should be prevented from darkening as compared with images of the other slices.

Moreover, there is placed a gap length GPb between the dummy slice b and slice L6. It is desirable to determine the gap length GPb from the viewpoint that the blood signals in the slice L6 should be reduced as much as possible and from the viewpoint that the image of the slice L6 should be prevented from darkening as compared with images of the other slices.

Figure 13:
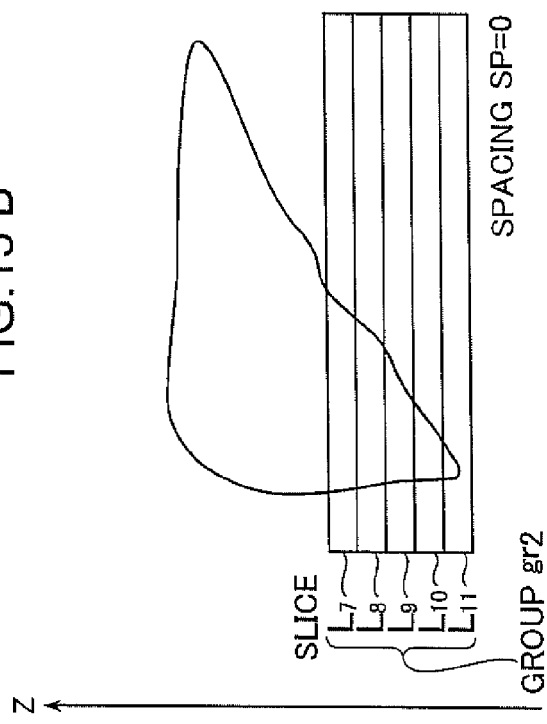
FIGS. 13A and 13B are diagrams showing slices L1 to L11 grouped into two groups gr1 and gr2.
Figure 13:
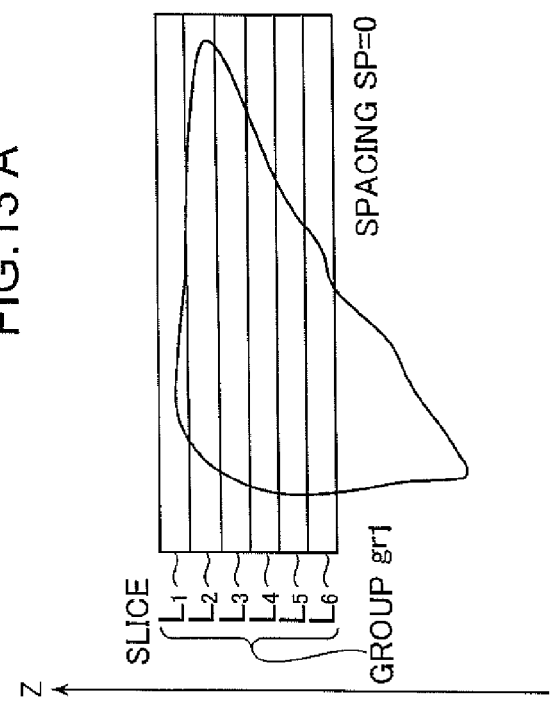

Additionally, since in the present embodiment, twelve slices are defined at Step ST1 (see FIG. 4), the groups gr1 and gr2 each include six slices (see FIGS. 5A and 5B). However, an odd number of slices may be defined at Step ST1 in some cases. For example, eleven slices may be defined at Step ST1. In this case, the grouping unit 92 makes grouping as shown in FIGS. 13A and 13B, for example. The group gr1 includes six slices L1 to L6, while the group gr2 includes five slices L7 to L11. While the spacing SP representing an interval between adjacent slices is set to SP=0 in FIG. 13, SP>0 or SP<0 (which means that the adjacent slices overlap each other) may hold. In the case that the slices L1 to L11 are grouped as shown in FIGS. 13A and 13B, the dummy-slice defining unit 93 defines dummy slices as described below (see FIGS. 14A and 14B).

FIGS. 14A and 14 B are diagrams showing dummy slices. While the dummy-slice defining unit 93 defines two dummy slices a and b in the group gr1, it defines three dummy slices c, d1, and d2 in the group gr2. Description of the dummy slices a and b will be omitted because they are the same as those in FIGS. 7A and 7B, and the three dummy slices c, d1, and d2 will be described hereinbelow.

The dummy slice c is defined in a region lying in a z-direction with respect to the group gr2 of slices. The slice thickness THc of the dummy slice c is defined to be greater than the slice thickness TH of the slices L7 to L11 (THc>TH). In the group gr2, the slice L7 lies closest to the dummy slice c. The dummy slice c is defined to place a gap length GPc between the dummy slice c and slice L7.

The dummy slice d1 is defined in a region lying in a direction ((−z)-direction) opposite to the z-direction with respect to the group gr2 of slices. The slice thickness THd1 of the dummy slice d1 is set to be same as the slice thickness TH of the slices L7 to L11 (THd1=TH). In the group gr2, the slice L11 lies closest to the dummy slice d1. A gap length GPd1 between the dummy slice d1 and slice L11 is defined as the same value as the spacing SP. Here, SP=0 (see FIGS. 13A and 13B), and therefore, GPd1=0.

The dummy slice d2 is defined in a region lying in a direction ((−z)-direction) opposite to the z-direction with respect to the group gr2 of slices. The slice thickness THd2 of the dummy slice d2 is set to be greater than the slice thickness TH of the slices L7 to L11 (THd2>TH). Moreover, the dummy slice d2 is defined to have a gap length GPd2 placed between the dummy slice d2 and dummy slice d1.

The gap lengths GPc and GPd2 are set to a few millimeters, for example. GPc and GPd2 may be such that GPc=GPd2 or GPc≠GPd2. In the present embodiment, GPc=GPd2.

In the sequence segment A, a sequence group SA is repetitively performed similarly to the method described with reference to FIG. 8. Therefore, the slices L1 to L6 in the group gr1, and dummy slices a and b are excited during the repetition time TR. Based on data acquired by the sequence segment A, images of the slices L1 to L6 in the group gr1 are then produced.

Figure 15:
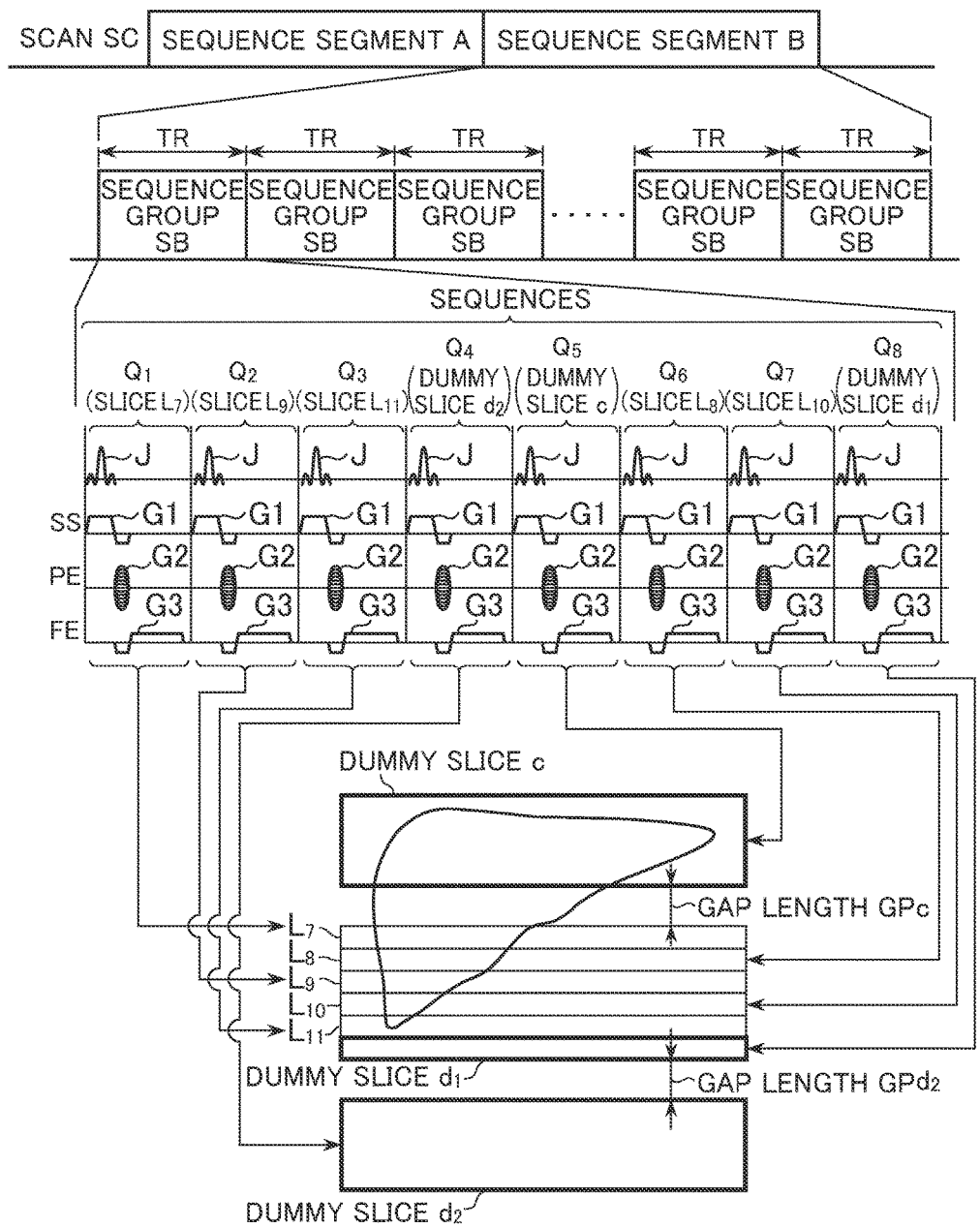
FIG. 15 is an explanatory diagram of a sequence segment B.

In the sequence segment B, a sequence is performed as described below (see FIG. 15). FIG. 15 is an explanatory diagram of the sequence segment B. The sequence group SB includes sequences Q1 to Q8.

The sequences Q1, Q2, and Q3 are sequences for exciting the slices L7, L9, and L11, respectively. The sequences Q4 and Q5 are sequences for exciting the dummy slices d2 and c, respectively. The sequences Q6 and Q7 are sequences for exciting the slice L8 and L10, respectively. The sequence Q8 is a sequence for exciting the dummy slice d1. Therefore, in FIG. 15, slice excitation is achieved in the order of the slices L7, L9, L11, dummy slices d2, c, slices L8, L10, and dummy slice d1.

Since in FIG. 15, the dummy slice d1 is defined in addition to the dummy slice d2 below the slice L11, the repetition time TR for the sequence group SB included in the sequence segment B may be equal to that of the sequence group SA included in the sequence segment A. Therefore, even when the number of slices in the group gr1 is different from that in the group gr2, image contrast of the slices L7 to L11 in the group gr2 may be brought sufficiently close to that of the slices L7 to L11 in the group gr1.

In the present embodiment, the slices L1 to L12 defined at Step ST1 are divided into a plurality of groups. According to the present invention, however, the slices L1 to L12 do not have to be always divided into a plurality of groups, and a dummy slice may be defined for the slices L1 to L12 (see FIG. 16).

Figure 16:
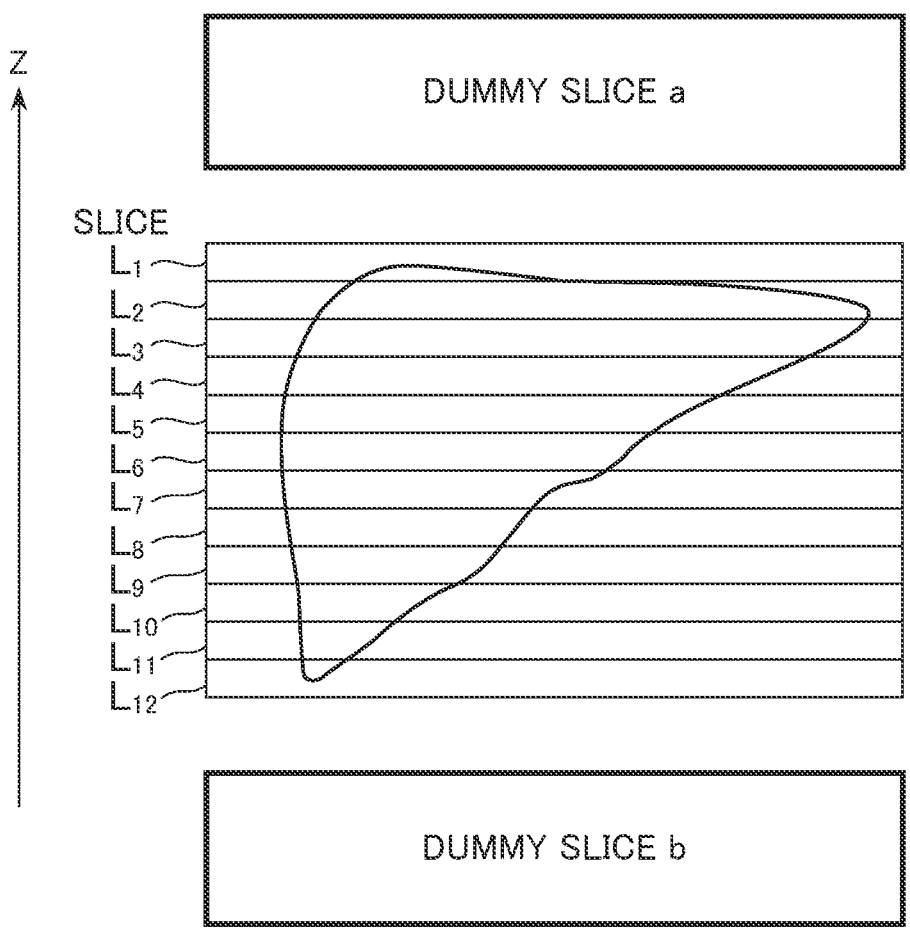
FIG. 16 is a diagram showing a case in which dummy slices a and b are defined for slices L1 to L12.

FIG. 16 shows a case in which the dummy slices a and b are defined for the slices L1 to L12. In FIG. 16, the dummy slice a is defined in a region lying in a z-direction with respect to the slices L1 to L12, while the dummy slice b is defined in a region lying in a direction ((−z)-direction) opposite to the z-direction with respect to the slices L1 to L12. In FIG. 16, the slice L1 lies closest to the dummy slice a, and the slice L12 lies closest to the dummy slice b. In the case that the dummy slices a and b are defined as shown in FIG. 16, a scan may be performed as described below (see FIG. 17).

Figure 17:
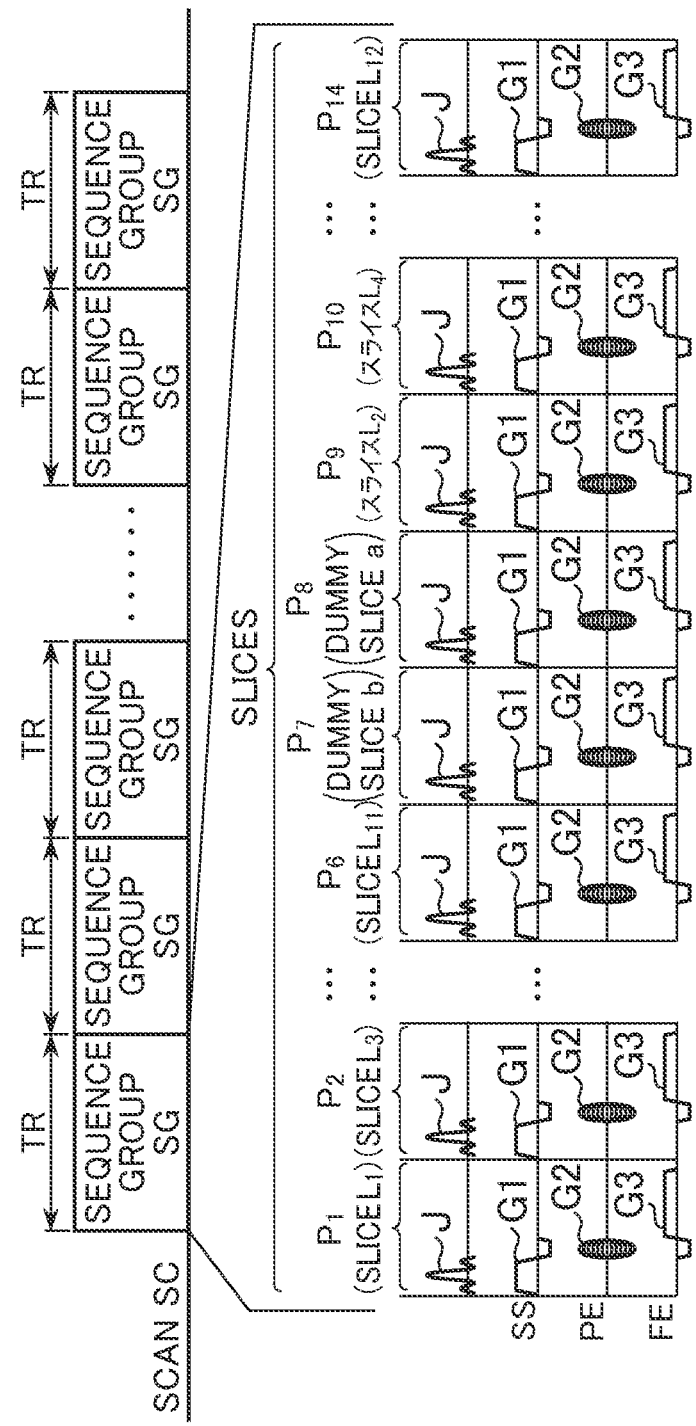
FIG. 17 is a diagram showing an exemplary scan for acquiring data from the slices L1 to L12 shown in FIG. 16.

FIG. 17 is a diagram showing an exemplary scan SC for acquiring data from the slices L1 to L12 shown in FIG. 16. It should be noted that some sequences are omitted in the drawing in FIG. 17 because of limitations of space.

Referring to FIG. 17, sequences P1 to P14 for exciting the slices L1 to L12 and dummy slices a and b are performed during a repetition time TR. The sequences P1 to P6 are sequences for exciting odd-numbered slices L1, L3, L5, L7, L9, and L11. The sequences P7 and P8 are sequences for exciting the dummy slices b and a, respectively. The sequences P9 to P14 are sequences for exciting even-numbered slices L2, L4, L6, L8, L10, and L12. Therefore, in FIG. 17, slice excitation is achieved in the order of the slices L1, L3, L5, L7, L9, L11, dummy slices b, a, and slices L2, L4, L6, L8, L10, and L12. In the scan in FIG. 17, only data acquired from the slices L1 to L12 are used as data for image reconstruction, and data acquired from the dummy slices a and b are discarded.

It should be noted that too long a repetition time TR may hamper obtainment of an image with desired quality. Therefore, it is desirable to define the repetition time TR so as not to exceed a specified upper-limit value (for example, 250 msec). However, in the case that the dummy slices a and b are defined for the slices L1 to L12 as shown in FIG. 17, the repetition time TR may sometimes exceed an upper-limit value because the slices L1 to L12 and dummy slices a and b must be excited within the repetition time TR. In such a case, it is desirable to divide the slices into a plurality of groups, and define dummy slices for each group, as shown in FIGS. 6A and 6B. By thus dividing the slices into a plurality of groups, the number of slices that should be excited within the repetition time TR may be reduced, thus preventing the repetition time TR from exceeding the upper-limit value. On the other hand, too short a repetition time TR may lead to reduction of the SNR or deteriorated contrast. Therefore, it is desirable to set the repetition time TR so as not to fall below a specified lower-limit value (for example, 120 msec).

Similarly, it is desirable to divide slices into a plurality of groups as shown in FIGS. 6A and 6B in the case that a scan should be performed on a subject (for example, elderly person) having trouble with long time breath-holding. In this case, the number of times of breath-holding by the subject is set to two for performing a scan on the subject. In particular, a first breath-hold is asked to the subject, and the sequence segment A is performed while the subject is holding his/her breath for the first time. After the sequence segment A has ended, the subject is asked to restart respiration, and after a certain period of time has elapsed, a second breath-hold is asked to the subject. Then, the sequence segment B is performed while the subject is holding his/her breath for the second time. By thus setting the number of times of breath-holding by the subject to more than one, images with reduced body-motion artifacts may be obtained even from a subject having trouble with long time breath-holding.

In the present embodiment, the slice thickness of the dummy slice is preset as a default value. However, information representing the slice thickness of the dummy slice may be input from the operating section to the computer by the operator operating the operating section. In this case, the dummy-slice defining unit 93 defines the slice thickness of the dummy slice based on the information input from the operating section. Therefore, the slice thickness of the dummy slice may be set to a slice thickness that the operator desires. Alternatively, the dummy-slice defining unit 93 may define the slice thickness of the dummy slice based on the flow velocity of blood flowing through the imaged region. In particular, it is desirable to set a greater slice thickness of the dummy slice for a higher blood flow velocity. By thus defining the slice thickness of the dummy slice, longitudinal magnetization of blood may be sufficiently decreased after blood has entered the dummy slice until it exits the dummy slice even for a higher blood flow velocity, thereby sufficiently reducing blood signals. It should be noted that the blood flow velocity may be manually input by the operator, or may be calculated based on data acquired by a sequence performed for measuring the blood flow velocity before performing the scan SC.

Moreover, while the gap lengths GPa, GPb, GPc, and GPd (see FIGS. 6A and 6B) have default values in the present embodiment, they may be modifiable by the operator.

What is claimed is:

1. A magnetic resonance apparatus comprising:
   a slice defining unit for defining a plurality of slices arranged in a first direction in a region including blood;
   a grouping unit for dividing said plurality of slices into a plurality of groups;
   a dummy-slice defining unit for defining a first dummy slice in a region lying in said first direction with respect to said group, and a second dummy slice in a region lying in a direction opposite to said first direction with respect to said group, said dummy-slice defining unit defining said first and second dummy slices so that a slice thickness of each of said first and second dummy slices is greater than that of each of said plurality of slices;
   a scanning section for repetitively performing a sequence group including a plurality of sequences for exciting slices included in said group, said first dummy slice, and said second dummy slice; and
   an image producing unit for producing an image of each of said plurality of slices based on data acquired by performing said sequence group.

2. The magnetic resonance apparatus as recited in claim 1, wherein:
   said group includes a first slice lying closest to said first dummy slice and a second slice lying closest to said second dummy slice,
   a first gap length is placed between said first dummy slice and said first slice, and
   a second gap length is placed between said second dummy slice and said second slice.

3. The magnetic resonance apparatus as recited in claim 2, wherein: said second gap length is equal to said first gap length.

4. The magnetic resonance apparatus as recited in claim 1, wherein:
   said plurality of groups include a first group and a second group, and
   said dummy-slice defining unit defines:
      a first dummy slice in a region lying in said first direction with respect to said first group, and a second dummy slice in a region lying in a direction opposite to said first direction with respect to said first group, and
      a third dummy slice in a region lying in said first direction with respect to said second group, and fourth and fifth dummy slices in a region lying in a direction opposite to said first direction with respect to said second group.

5. The magnetic resonance apparatus as recited in claim 4, wherein:
   said scanning section performs a plurality of sequences segments,
   in first one of said plurality of sequences segments, a sequence group is performed including a plurality of sequences for exciting slices included in said first group, said first dummy slice, and said second dummy slice, and
   in a second one of said plurality of sequences segments, a sequence group is performed including a plurality of sequences for exciting slices included in said second group, said third dummy slice, said fourth dummy slice, and said fifth dummy slice.

6. The magnetic resonance apparatus as recited in claim 5, wherein:
   said dummy-slice defining unit defines said fourth dummy slice to lie closer to said second group than said fifth dummy slice does.

7. The magnetic resonance apparatus as recited in claim 6, wherein:
   said second group includes a third slice lying closest to said third dummy slice and a fourth slice lying closest to said fourth dummy slice,
   a third gap length is placed between said third dummy slice and said third slice, and
   a fourth gap length is placed between said fourth dummy slice and said fourth slice.

8. The magnetic resonance apparatus as recited in claim 7, wherein said fourth gap length is defined as the same value as spacing representing an interval between mutually adjacent ones of the plurality of slices included in said second group.

9. The magnetic resonance apparatus as recited in claim 7, wherein a fifth gap length is placed between said fourth and fifth dummy slices.

10. The magnetic resonance apparatus as recited in claim 9, wherein said fifth gap length is equal to said third gap length.

11. The magnetic resonance apparatus as recited in claim 5, wherein: a slice thickness of said fourth dummy slice is the same as that of a slice included in said second group.

12. The magnetic resonance apparatus as recited in claim 1, wherein: said dummy-slice defining unit defines a slice thickness of the first dummy slice and a slice thickness of the second dummy slice based on a flow velocity of said blood.

13. The magnetic resonance apparatus as recited in claim 1, wherein:
said sequence group includes a first sequence for exciting said first dummy slice, a second sequence for exciting said second dummy slice, and a third sequence for exciting said slice.

14. The magnetic resonance apparatus as recited in claim 13, wherein:
said first sequence includes a first excitation pulse for exciting said first dummy slice and a first slice selective gradient pulse for selecting said first dummy slice,
said second sequence includes a second excitation pulse for exciting said second dummy slice and a second slice selective gradient pulse for selecting said second dummy slice,
said third sequence includes a third excitation pulse for exciting said slice and a third slice selective gradient pulse for selecting said slice,
said first and second excitation pulses have the same waveform as that of said third excitation pulse, and
a magnetic field intensity for said first and second slice selective gradient pulses is lower than that for said third slice selective gradient pulse.

15. A magnetic resonance apparatus comprising:
a slice defining unit for defining a plurality of slices arranged in a first direction in a region including blood;
a dummy-slice defining unit for defining a first dummy slice in a region lying in said first direction with respect to said plurality of slices, and a second dummy slice in a region lying in a direction opposite to said first direction with respect to said plurality of slices, said dummy-slice defining unit defining said first and second dummy slices so that a slice thickness of each of said first and second dummy slices is greater than that of each of said plurality of slices;
an input section for inputting information representing a slice thickness of a dummy slice, wherein said dummy-slice defining unit defines a slice thickness of a dummy slice based on the information input from said input section,
a scanning section for repetitively performing a sequence group including a plurality of sequences for exciting said plurality of slices, said first dummy slice, and said second dummy slice, respectively; and
an image producing unit for producing an image of each of said plurality of slices based on data acquired by performing said sequence group.

* * * * *